(12) United States Patent
Huang et al.

(10) Patent No.: US 7,679,172 B2
(45) Date of Patent: Mar. 16, 2010

(54) SEMICONDUCTOR PACKAGE WITHOUT CHIP CARRIER AND FABRICATION METHOD THEREOF

(75) Inventors: Chien-Ping Huang, Taichung (TW); Fu-Di Tang, Taichung (TW); Yuan-Chun Li, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 11/488,689

(22) Filed: Jul. 19, 2006

(65) Prior Publication Data

US 2007/0018291 A1 Jan. 25, 2007

(30) Foreign Application Priority Data

Jul. 19, 2005 (TW) ............................... 94124272 A

(51) Int. Cl.
*H01L 23/495* (2006.01)
(52) U.S. Cl. ...................... 257/678; 257/666; 257/668; 257/676; 257/E23.007; 257/E23.068
(58) Field of Classification Search ................ 257/668, 257/676, 678, E23.061, E23.007, E23.068, 257/666

See application file for complete search history.

(56) References Cited

U.S. PATENT DOCUMENTS

| | | | | |
|---|---|---|---|---|
| 6,429,508 | B1* | 8/2002 | Gang | 257/678 |
| 7,009,286 | B1* | 3/2006 | Kirloskar et al. | 257/684 |
| 2002/0190362 | A1* | 12/2002 | Khan et al. | 257/678 |
| 2003/0034553 | A1* | 2/2003 | Ano | 257/690 |

* cited by examiner

*Primary Examiner*—Eugene Lee
*Assistant Examiner*—Peniel M Gumedzoe
(74) *Attorney, Agent, or Firm*—Birch, Stewart, Kolasch & Birch, LLP

(57) ABSTRACT

A semiconductor package without a chip carrier includes an insulating structure having an opening; an electroplated die pad provided in the opening; a chip attached to the electroplated die pad by a thermally conductive adhesive; a plurality of electrical contacts formed around the electroplated die pad, wherein at least one of the electrical contacts is provided on a top surface of the insulating structure, and the chip is electrically connected to the electrical contacts; and an encapsulant for encapsulating the chip, the insulating structure and the electrical contacts, wherein bottom surfaces of the insulating structure, the electroplated die pad and the electrical contacts, except the at least one electrical contact provided on the top surface of the insulating structure, are exposed from the encapsulant and are flush with a bottom surface of the encapsulant. A fabrication method of the semiconductor package is also provided.

27 Claims, 9 Drawing Sheets

SEMICONDUCTOR PACKAGE WITHOUT CHIP CARRIER AND FABRICATION METHOD THEREOF

FIELD OF THE INVENTION

The present invention relates to semiconductor packages and fabrication methods thereof, and more particularly, to a semiconductor package without a chip carrier and a fabrication method of the semiconductor package.

BACKGROUND OF THE INVENTION

Conventional Quad Flat Non-leaded (QFN) semiconductor package is structured as disclosed in U.S. Pat. No. 6,583,499 and is shown in FIG. 4, wherein a chip 41 is attached to a die pad 420 of a lead frame 42 and is electrically connected to leads 421 of the lead frame 42 via gold wires 43, and an encapsulant 44 is formed for encapsulating the chip 41, the lead frame 42 and the gold wires 43, with bottom surfaces of both the die pad 420 and the leads 421 being exposed from the encapsulant 44, such that the leads 421 can be implanted with solder balls or electrically connected to a printed circuit board (PCB) by solder paste.

The above QFN package advantageously does not have the leads extended out of the encapsulant and thus does not occupy a relatively larger area of the PCB unlike a Quad Flat Package (QFP). In view of the size and thickness requirements for the current semiconductor package, the QFN package has a satisfactorily small size, but it is still not considered thin enough or cannot be further reduced in thickness with the thickness of the lead frame (usually up to 200 μm) being taken into account.

Accordingly, to solve the above problem in terms of thickness, a semiconductor package without a lead frame is provided as disclosed in U.S. Pat. No. 5,830,800. This semiconductor package 5, as shown in FIG. 5, includes a plurality of electroplated pads 51 formed on a copper carrier (not shown), wherein the thickness of the electroplated pads 51 is only about 6 μm. A chip 52 is mounted on the copper carrier by silver paste, and is electrically connected to the electroplated pads 51 via a plurality of gold wires 53. An encapsulant 54 is formed for encapsulating the electroplated pads 51, the chip 52 and the gold wires 53. After forming the encapsulant 54, the copper carrier is removed by a chemical etching process, such that bottom surfaces of the electroplated pads 51 are exposed from the encapsulant 54. Finally, a plurality of solder balls 55 are implanted to the exposed electroplated pads 51.

Although the above semiconductor package 5 is thinner than a conventional lead-frame-based semiconductor package, only the electroplated pads 51 under the chip 52 serve as a heat dissipating medium for the chip 52 and thus make the total heat dissipating area of the semiconductor package 5 limited. Consequently, heat generated from the chip 52 during operation cannot be dissipated effectively only through the electroplated pads 51, such that electrical performance of the semiconductor package 5 may be adversely affected and even the chip 52 may be damaged.

To address the problem of heat dissipation for the chip, it is preferable to incorporate the die pad used in the QFN package into the above semiconductor package 5 by a plating technique to have the chip connected to the electroplated die pad such that the heat from the chip can be dissipated directly to an external environment through the electroplated die pad having a relatively larger heat dissipating area. This forms a semiconductor package 6 as shown in FIG. 6. However, if the surface area of the electroplated die pad 61 is larger than or equal to that of the chip 62 and if there are signal pads (not shown) or passive components 630 provided in a region, corresponding to the electroplated die pad 61, of a circuited board 63 to which the semiconductor package 6 is mounted, when the electroplated die pad 61 is bonded to the corresponding region of the circuit board 63 by solder paste 64, the solder paste 64 would cover and/or come into contact with the signal pads or the passive components 630, thereby resulting in short circuit.

In order to avoid short circuit, a strategy is to position the signal pads or the passive components 630 outside the region of the circuit board 63 covered by the solder paste 64. However, this undesirably alters the circuit layout of the circuit board, and thus increases the costs, sets a limitation on the circuit layout, as well as increases the design difficulty.

As an alternative, a semiconductor package 7 without altering the circuit layout of the circuit board is provided as shown in FIG. 7, wherein the electroplated die pad 71 is reduced to a size smaller than that of the chip 75, such that the solder paste 74 for bonding the electroplated die pad 71 to the circuit board 73 would not cover or come into contact with the signal pads or passive components 730 that are formed on the circuit board 73 and under the chip 75. However, if the thickness of the electroplated die pad 71 is smaller than 10 μm, space S between a bottom surface of the chip 75 and a bottom surface of the encapsulant 76 may become relatively small, for example, there may be a small distance (between 20 μm and 30 μm) left from the bottom surface of the chip 75 to the bottom surface of the encapsulant 76. As a result, a resin compound for forming the encapsulant 76 cannot be filled into the space S completely during a molding process of forming the encapsulant 76, such that voids 760 and/or recesses 761 are possibly formed, thereby degrading the reliability of the semiconductor package due to the voids 760 and/or adversely affecting the appearance of the semiconductor package due to the recesses 761.

As another alternative, if it is to alter the circuit layout of the circuit board, a semiconductor package 8 is provided as shown in FIG. 8, wherein signal pads or passive components 830 of the circuit board 83 are relocated to positions outside the region under the electroplated die pad 81, making the solder paste 84 not cover or come into contact with the signal pads or the passive components 830. Moreover, a ground ring 850 and a power ring 851 are additionally provided and are electrically connected to the chip 85. However, during a reflowing process for bonding the semiconductor package 8 to the circuit board 83 via the solder paste 84, since the ground ring 850 is located very close to the power ring 851, the solder paste 84 being reflowed may come into contact with the power ring 851 and ground the power ring 851 to the circuit board 83, thereby causing short circuit as indicated by S1 in FIG. 8. Accordingly, even by altering the circuit layout of the circuit board 83, none of the foregoing semiconductor packages without chip carriers can be adapted to incorporate a power ring to improve the electrical performance thereof without having the aforementioned drawbacks.

Therefore, the problem to be solved here is to provide a semiconductor package without a chip carrier, which can effectively overcome or eliminate the foregoing drawbacks.

SUMMARY OF THE INVENTION

In light of the above drawbacks of the prior art, an objective of the present invention is to provide a semiconductor package without a chip carrier and a fabrication method thereof, so as not to affect a circuit layout of a circuit board to which the semiconductor package is mounted.

Another objective of the present invention is to provide a semiconductor package without a chip carrier and a fabrication method thereof, which can avoid voids being formed under a chip, thereby ensuring the reliability of the semiconductor package.

Still another objective of the present invention is to provide a semiconductor package without a chip carrier and a fabrication method thereof, which can ground a chip to a circuit board and avoid voids being formed under the chip, thereby ensuring the reliability of the semiconductor package.

A further objective of the present invention is to provide a semiconductor package without a chip carrier and a fabrication method thereof, which can provide a ground ring in a way without having the ground ring coming into contact with components of a circuit board, so as to prevent short circuit.

A further objective of the present invention is to provide a semiconductor package without a chip carrier and a fabrication method thereof, which can provide a ground ring and a power ring in a way without having the power ring grounded to a circuit board, so as to prevent short circuit.

In accordance with the above and other objectives, the present invention proposes a semiconductor package without a chip carrier, comprising: an insulating structure having an opening; an electroplated die pad provided in the opening; a chip attached to the electroplated die pad by a thermally conductive adhesive; a plurality of electrical contacts formed around the electroplated die pad, wherein at least one of the electrical contacts is provided on a top surface of the insulating structure; a plurality of electrical connection members for electrically connecting the chip to the electrical contacts; and an encapsulant for encapsulating the chip, the insulating structure, the electrical connection members and the electrical contacts, wherein a bottom surface of the insulating structure, a bottom surface of the electroplated die pad, and bottom surfaces of the electrical contacts, except the at least one electrical contact provided on the top surface of the insulating structure, are exposed from the encapsulant and are flush with a bottom surface of the encapsulant.

The insulating structure may be made of thermoelastic resin or other insulating compounds, and preferably, the insulating structure is made of a material to provide elasticity for the insulating structure. With the insulating structure having elasticity, the effect of thermal stress from the encapsulant on the chip can be reduced, such that the semiconductor package is less likely to be warped or is subject to less degree of warpage.

The size of the electroplated die pad may be equal to or larger than the cross-sectional area of the opening, such that a peripheral portion of the electroplated die pad may cover a portion of the insulating structure.

By the above arrangement of the insulating structure and the electroplated die pad, there is no space present under the chip in the semiconductor package, thereby avoiding voids being formed under the chip. Moreover, the size of the electroplated die pad in the opening of the insulating structure can be desirably reduced, such that the electroplated die pad does not affect a circuit layout of a circuit board to which the semiconductor package is mounted but provides a heat dissipating path for the chip.

The present invention also proposes a fabrication method of a semiconductor package without a chip carrier, comprising the steps of: forming an insulating structure on a carrier, the insulating structure having an opening; forming a plurality of electrical contacts on the carrier and an electroplated die pad in the opening by an electroplating process, wherein at least one of the electrical contacts is provided on a top surface of the insulating structure; attaching a chip to the electroplated die pad by a thermally conductive adhesive, so as to allow heat generated from the chip to be transmitted to the electroplated die pad through the thermally conductive adhesive; electrically connecting the chip to the electrical contacts by a plurality of electrical connection members; forming an encapsulant for encapsulating the chip, the insulating structure, the electrical contacts and the electrical connection members, wherein a bottom surface of the insulating structure, a bottom surface of the electroplated die pad, and bottom surfaces of the electrical contacts, except the at least one electrical contact provided on the top surface of the insulating structure, are exposed from the encapsulant and are flush with a bottom surface of the encapsulant; and removing the carrier.

It should be understood that the above fabrication method is not limited to the use of a single chip but is also applicable to a batch-type manner of fabricating semiconductor packages through the use of a plurality of chips at one time. It should also be understood that the above fabrication method is not only for packaging a single chip with a larger size but also suitable for packaging a plurality of smaller chips in a batch-type manner. In the case of packaging a plurality of chips at one time, the fabrication method should include a step of performing a singulation process after the carrier is removed.

The insulating structure may be formed by screen-printing a material such as a resin compound on the carrier, or the insulating structure can be preformed and then attached to a predetermined position of the carrier.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a semiconductor package without a chip carrier and a fabrication method thereof as proposed in the present invention are described as follows with reference to FIGS. 1, 2A-2F and 3A-3H. It should be noted that the drawings are simplified schematic diagrams only showing components or elements relevant to the present invention, and the layout of components or elements of the semiconductor package could be more complicated in the practical implementation.

Figure 1:
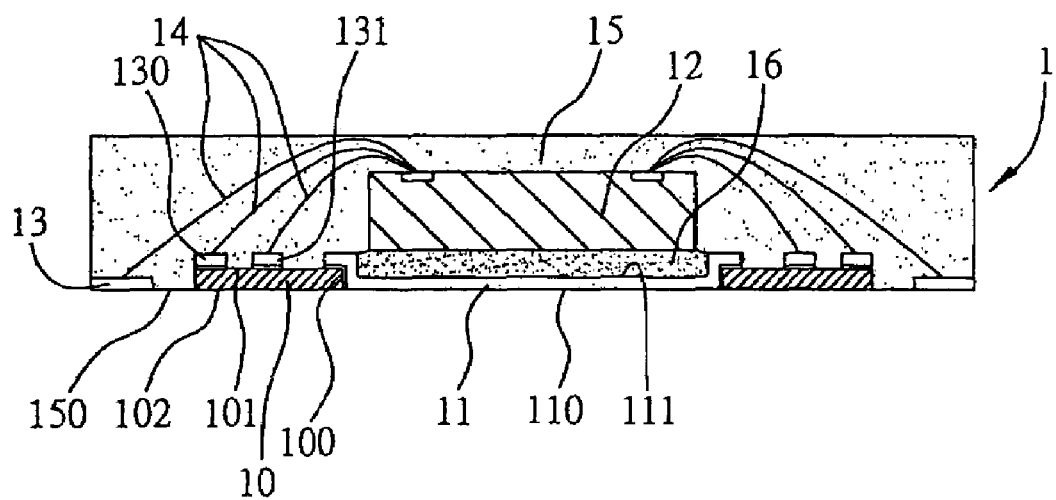
FIG. 1 is a schematic cross-sectional view of a semiconductor package without a chip carrier according to a first embodiment of the present invention.

FIG. 1 shows a cross-sectional view of a semiconductor package 1 without a chip carrier according to a first embodiment of the present invention. The semiconductor package 1 comprises an insulating structure 10 having an opening 100; an electroplated die pad 11 coupled to the insulating structure 10 and exposed in the opening 100; a chip 12 attached to the electroplated die pad 11; a plurality of electrical contacts 13, 130, 131 provided around the insulating structure 10; a plurality of electrical connection members such as gold wires 14 for electrically connecting the chip 12 to the electrical contacts 13, 130, 131; and an encapsulant 15 for encapsulating the chip 12, the insulating structure 10, the electrical contacts 13, 130, 131 and the gold wires 14.

The cross-sectional area of the opening 100 of the insulating structure 10 may be larger than, equal to or smaller than the size of the electroplated die pad 11. As shown in FIG. 1, the cross-sectional area of the opening 100 is smaller than the size of the electroplated die pad 11 and larger than the size of the chip 12, such that a portion of the insulating structure 10 is covered by a peripheral portion of the electroplated die pad 11, and besides covering the insulating structure 10, a bottom surface 110 of the electroplated die pad 11 is also exposed in the opening 100. The insulating structure 10 is primarily made of an insulating material, preferably thermoelastic resin. With the insulating structure 10 having elasticity, the effect of thermal stress on the chip 12 due to mismatch in coefficient of thermal expansion (CTE) between different materials of components can be reduced, thereby increasing the reliability of the semiconductor package 1. Moreover, a top surface 101 of the insulating structure 10, besides being partly covered by the electroplated die pad 11, is also formed with the electrical contacts such as a ground ring 131 and a power ring 130 thereon. The electrical contacts 130, 131 formed on the top surface 101 of the insulating structure 10 are not exposed from a bottom surface 150 of the encapsulant 15, such that the electrical contacts 130, 131 do not affect a circuit layout of a circuit board (not shown) to which the semiconductor package 1 is mounted, as well as the electrical contact (ground ring) 131 does not come into contact with components of the circuit board and the electrical contact (power ring) 130 is prevented from being grounded to the circuit board, thereby avoiding short circuit and eliminating the drawbacks of the prior art. By providing the insulating structure 10, the semiconductor package 1 can incorporate various electrical contacts such as the ground ring 131 and the power ring 130, without having to alter the circuit layout of the circuit board and with the foregoing advantage of avoiding short circuit of the electrical contacts 130, 131.

In this embodiment, the size of the electroplated die pad 11 is equal to or larger than that of the chip 12. Since the peripheral portion of the electroplated die pad 11 covers the portion of the insulating structure 10, the actual size of the bottom surface 110 of the electroplated die pad 11 exposed from the bottom surface 150 of the encapsulant 15 is close to or slightly larger than the size of the chip 12, thereby not affecting the circuit layout of the circuit board to which the semiconductor package 1 is bonded. The electroplated die pad 11 and the electrical contacts 13, 130, 131 are formed by an electroplating process. As the electroplated die pad 11 is larger than the chip 12 in size, there is no space present under the chip 12, such that incomplete filling of the encapsulant 15 during a molding process of forming the encapsulant 15 and formation of voids are avoided in the semiconductor package 1, making the semiconductor package 1 have desirable reliability.

The chip 12 is attached to a top surface 111 of the electroplated die pad 11 by a thermally conductive adhesive 16 such as silver paste or an adhesive mixed with thermally conductive particles, wherein the thermally conductive adhesive 16 fills the space between the chip 12 and the electroplated die pad 11. Thus, heat generated from the chip 12 during operation can be transmitted to the electroplated die pad 11 through the thermally conductive adhesive 16 and then dissipated out of the semiconductor package 1 through the electroplated die pad 11. Such heat dissipating path allows the heat from the chip 12 to be effectively dissipated and the electroplated die pad 11 larger in size than the chip 12 provides a large heat dissipating area, such that a satisfactory heat dissipating efficiency of the semiconductor package 1 can be ensured.

After the encapsulant 15 is formed, a bottom surface 102 of the insulating structure 10, the bottom surface 110 of the electroplated die pad 11, and bottom surfaces of the electrical contacts 13 are exposed from the encapsulant 15 and are flush with the bottom surface 150 of the encapsulant 15. This arrangement prevents poor flatness and incomplete electrical connection between the semiconductor package 1 and the circuit board (not shown) when the electroplated die pad 11 and the electrical contacts 13 are bonded to corresponding regions of the circuit board via solder paste.

Figure 2A:
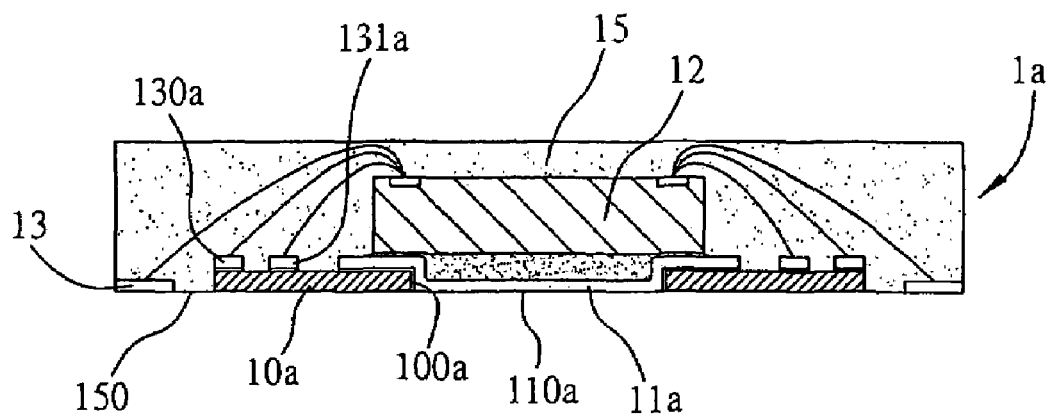
FIG. 2A is a schematic cross-sectional view of a semiconductor package without a chip carrier according to a second embodiment of the present invention.

FIG. 2A shows a cross-sectional view of a semiconductor package 1a without a chip carrier according to a second embodiment of the present invention, wherein like components in the first and second embodiments are designated with like reference numerals, and the detailed descriptions of these components are omitted in the second embodiment in order to make the disclosure of the present invention easier to be understood.

The semiconductor package 1a of the second embodiment has a similar structure and achieves similar effects to the semiconductor package 1 of the first embodiment. Compared with the semiconductor package 1, the semiconductor package 1a differs in having the opening 100a of the insulating structure 10a smaller than the chip 12 in size, but similarly has the size of the electroplated die pad 11a larger than that of the chip 12, such that a peripheral portion of the electroplated die pad 11a covers more of the insulating structure 10a. The electrical contacts such as a ground ring 131a and a power ring 130a are similarly formed on the insulating structure 10a, but the actual size of the bottom surface 110a of the electroplated die pad 11a exposed from the bottom surface 150 of the encapsulant 15 is smaller than the size of the chip 12. Accordingly, more space for the circuit layout of the circuit board (not shown) to which the semiconductor package 1a is bonded can be provided, so as to increase the flexibility of the circuit layout of the circuit board.

Figure 2B:
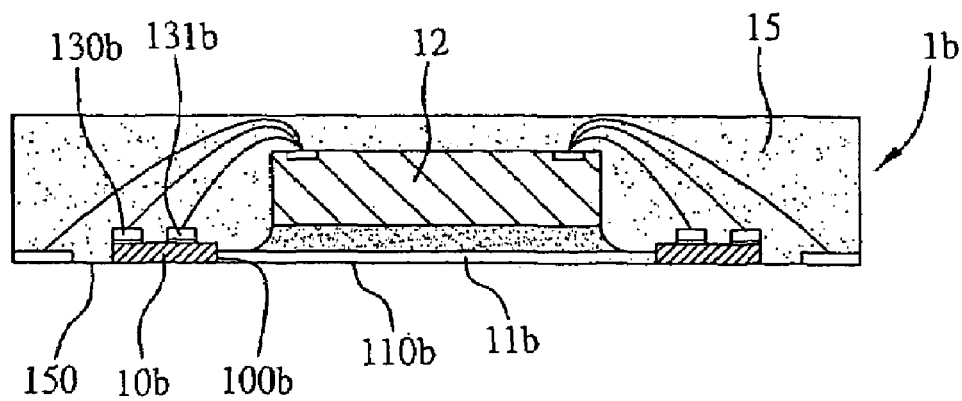
FIG. 2B is a schematic cross-sectional view of a semiconductor package without a chip carrier according to a third embodiment of the present invention.

FIG. 2B shows a cross-sectional view of a semiconductor package 1b without a chip carrier according to a third embodiment of the present invention, wherein like components in the first and third embodiments are designated with like reference numerals, and the detailed descriptions of these components are omitted in the third embodiment in order to make the disclosure of the present invention easier to be understood.

The semiconductor package 1b of the third embodiment has a similar structure and achieves similar effects to the semiconductor package 1 of the first embodiment. Compared with the semiconductor package 1, the semiconductor package 1b differs in having the size of the opening 100b of the insulating structure 10b equal to the size of the electroplated die pad 11b and larger than the size of the chip 12, but similarly has the size of the electroplated die pad 11b equal to or larger than the size of the chip 12, such that a peripheral portion of the electroplated die pad 11b does not cover the insulating structure 10b. The electrical contacts such as a ground ring 131b and a power ring 130b are similarly provided on the insulating structure 10b.

Figure 2C:
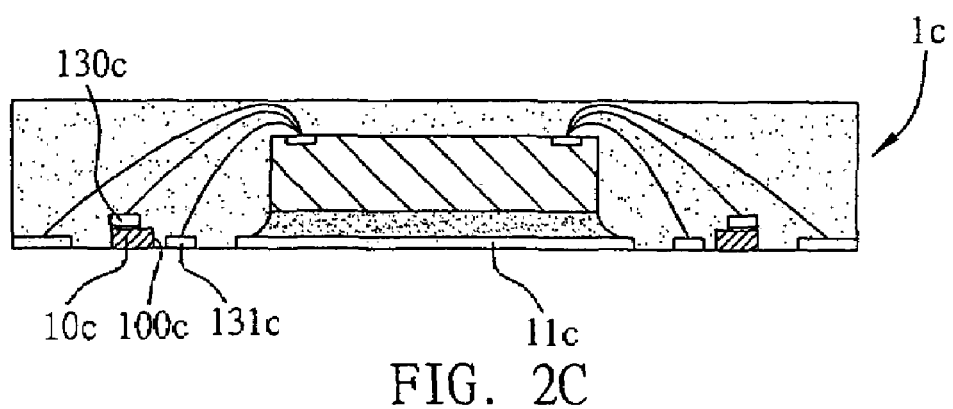
FIG. 2C is a schematic cross-sectional view of a semiconductor package without a chip carrier according to a fourth embodiment of the present invention.

FIG. 2C shows a cross-sectional view of a semiconductor package 1c without a chip carrier according to a fourth embodiment of the present invention, wherein like components in the first and fourth embodiments are designated with like reference numerals, and the detailed descriptions of these components are omitted in the fourth embodiment in order to make the disclosure of the present invention easier to be understood.

The semiconductor package 1c of the fourth embodiment has a similar structure and achieves similar effects to the semiconductor package 1 of the first embodiment. Compared with the semiconductor package 1, the semiconductor package 1c differs in increasing the size of the opening 100c of the insulating structure 10c to be larger than both the chip 12 and the electroplated die pad 11c, but similarly has the electroplated die pad 11c large in size than the chip 12, such that a peripheral portion of the electroplated die pad 11c does not cover the insulating structure 10c. Moreover in the semiconductor package 1c, an electrical contact such as power ring 130c is similarly formed on the insulating structure 10c, but an electrical contact such as ground ring 131c is not provided on the insulating structure 10c.

Figure 2D:
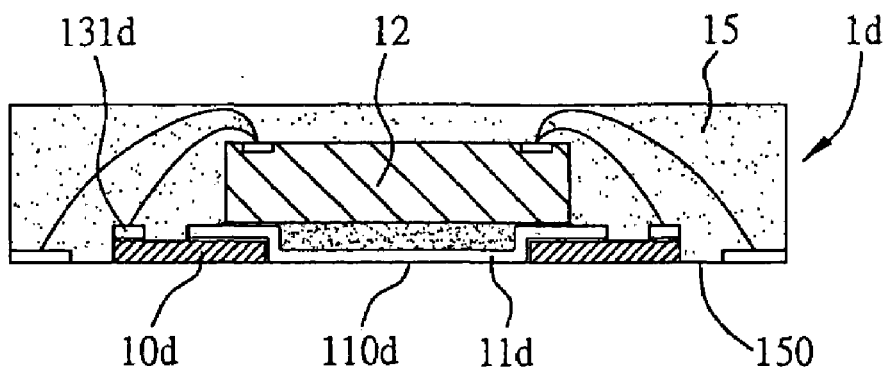
FIG. 2D is a schematic cross-sectional view of a semiconductor package without a chip carrier according to a fifth embodiment of the present invention.

FIG. 2D shows a cross-sectional view of a semiconductor package 1d without a chip carrier according to a fifth embodiment of the present invention, wherein like components in the second and fifth embodiments are designated with like reference numerals, and the detailed descriptions of these components are omitted in the fifth embodiment in order to make the disclosure of the present invention easier to be understood.

The semiconductor package 1d of the fifth embodiment has a similar structure and achieves similar effects to the semiconductor package 1a of the second embodiment. Compared with the semiconductor package 1a, the semiconductor package 1d differs in that the electrical contact 131d provided on the insulating structure 10d includes a ground ring but not a power ring, but the semiconductor package 1d similarly has the size of the electroplated die pad 11d larger than the size of the chip 12, such that the actual size of the bottom surface 110d of the electroplated die pad 11d exposed from the bottom surface 150 of the encapsulant 15 is much smaller than the size of the chip 12. This arrangement similarly provides more space for the circuit layout of the circuit board (not shown) to which the semiconductor package 1d is bonded, thereby increasing the flexibility of the circuit layout of the circuit board.

Figure 2E:
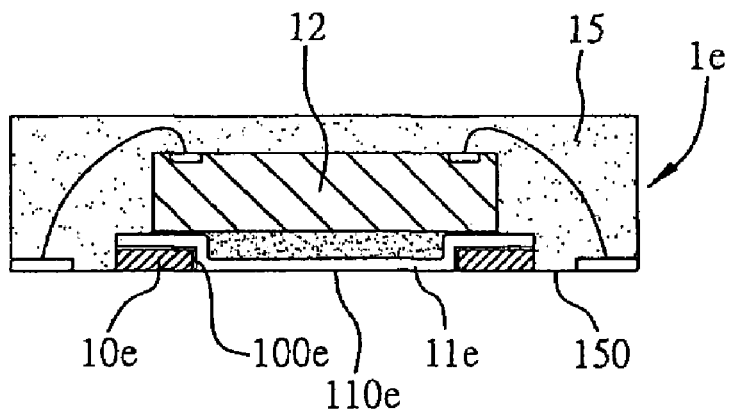
FIG. 2E is a schematic cross-sectional view of a semiconductor package without a chip carrier according to a sixth embodiment of the present invention.

FIG. 2E shows a cross-sectional view of a semiconductor package 1e without a chip carrier according to a sixth embodiment of the present invention, wherein like components in the second and sixth embodiments are designated with like reference numerals, and the detailed descriptions of these components are omitted in the sixth embodiment in order to make the disclosure of the present invention easier to be understood.

The semiconductor package 1e of the sixth embodiment has a similar structure and achieves similar effects to the semiconductor package 1a of the second embodiment. Compared with the semiconductor package 1a, the semiconductor package 1e differs in that there is no electrical contact provided on the insulating structure 10e and the size of the insulating structure 10e is approximately equal to the size of the electroplated die pad 11e, but the semiconductor package 1e similarly has the size of the opening 100e of the insulating structure 10e smaller than the size of the chip 12 and has the size of the electroplated die pad 1e larger than the size of the chip 12. As a result, the actual size of the bottom surface 10e of the electroplated die pad 11e exposed from the bottom surface 150 of the encapsulant 15 is much smaller than the size of the chip 12, such that more space for the circuit layout of the circuit board (not shown) to which the semiconductor package 1e is bonded can be provided, thereby increasing the flexibility of the circuit layout of the circuit board.

Figure 2F:
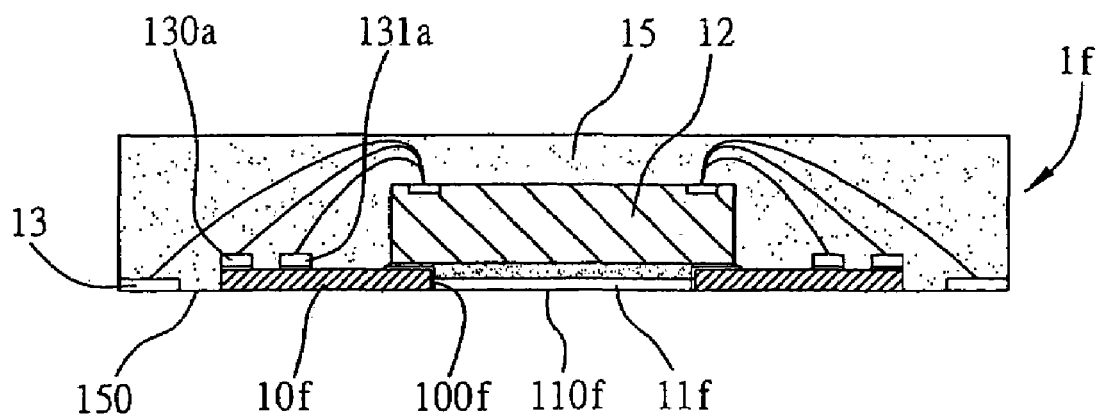
FIG. 2F is a schematic cross-sectional view of a semiconductor package without a chip carrier according to a seventh embodiment of the present invention.

FIG. 2F shows a cross-sectional view of a semiconductor package 1f without a chip carrier according to a seventh embodiment of the present invention, wherein like components in the second and seventh embodiments are designated with like reference numerals, and the detailed descriptions of these components are omitted in the seventh embodiment in order to make the disclosure of the present invention easier to be understood.

The semiconductor package 1f of the seventh embodiment has a similar structure and achieves similar effects to the semiconductor package 1a of the second embodiment. Compared with the semiconductor package 1a, the semiconductor package 1f differs in that the size of the electroplated die pad 11f is smaller than the size of the chip 12, but the semiconductor package 1f similarly has the size of the insulating structure 10f larger than the size of the electroplated die pad 11f and has the opening 100f of the insulating structure 10f smaller in size than the chip 12. As such, the actual size of the bottom surface 110f of the electroplated die pad 11f exposed from the bottom surface 150 of the encapsulant 15 is much smaller than the size of the chip 12, and the chip 12 is attached to both the electroplated die pad 11f and the insulating structure 10f. This arrangement provides more space for the circuit layout of the circuit board (not shown) to which the semiconductor package 1f is bonded, so as to increase the flexibility of the circuit layout of the circuit board.

A fabrication method of the semiconductor package 1 according to the first embodiment of the present invention is illustrated as follows with reference to FIGS. 3A to 3H.

Figure 3A:
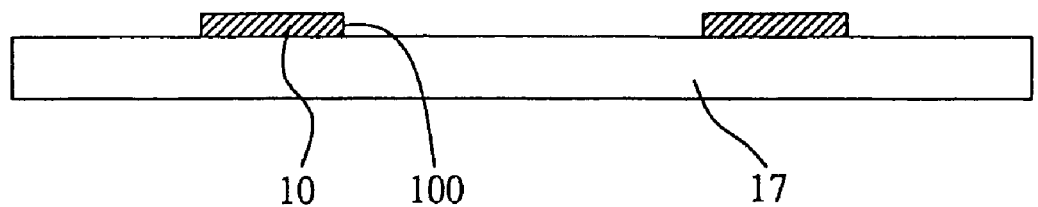
FIGS. 3A to 3H are schematic diagrams showing the steps of a fabrication method of the semiconductor package according to the first embodiment of the present invention.

Referring to FIG. 3A, firstly, an insulating structure 10 made of an insulating material is printed on a carrier 17 by a screen-printing process or any other suitable conventional techniques, and the fabricated insulating structure 10 is formed with an opening 100 at a central position thereof, making the insulating structure 10 have a ring shape. The insulating structure 10 may be made of a polymer material such as epoxy resin or solder mask. Alternatively, the insulating structure 10 may be preformed, for example by cutting and shaping a polyimide resin tape to fabricate the insulating structure 10 with the opening 100, and then the preformed insulating structure 10 is directly adhered to the carrier 17. The carrier 17 is a metallic plate such as a copper plate to provide a current conduction path for a subsequent plating process.

Figure 3B:
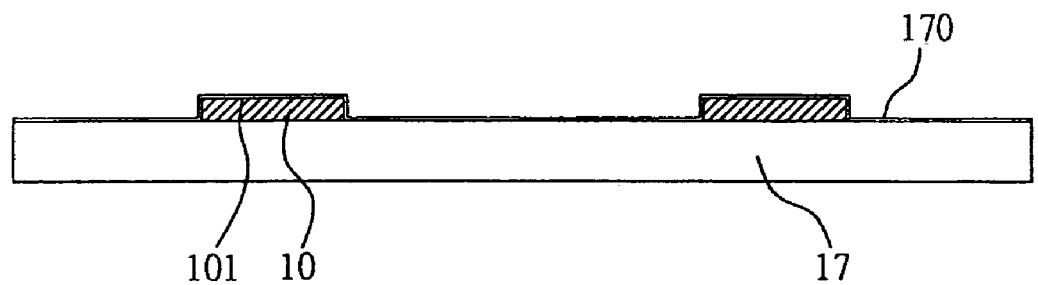
Figure 3C:
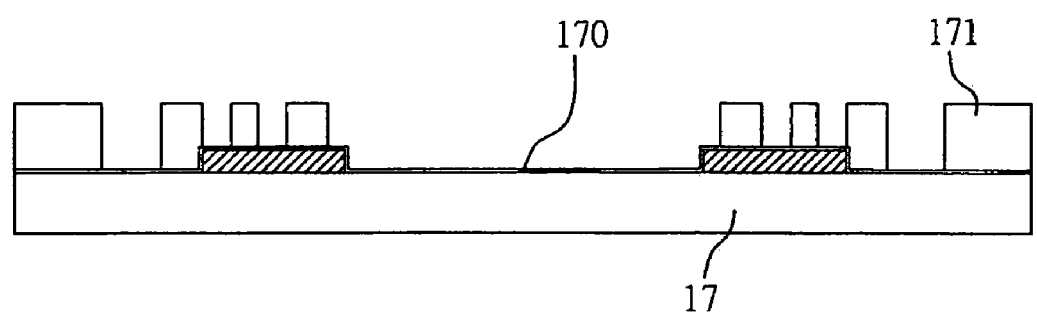
Figure 3D:
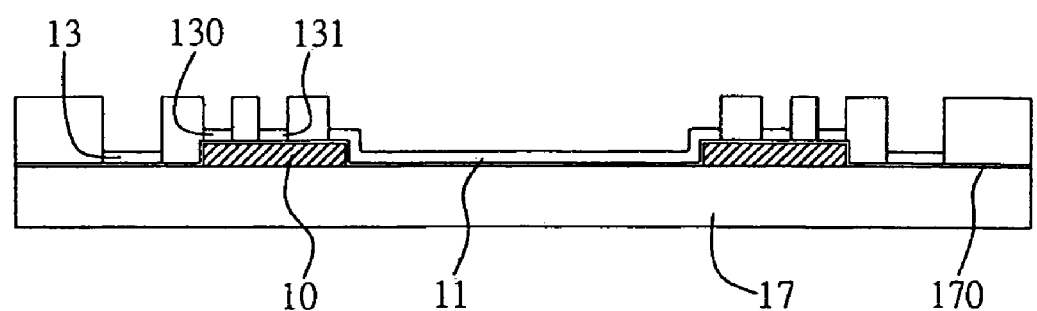
Figure 3E:
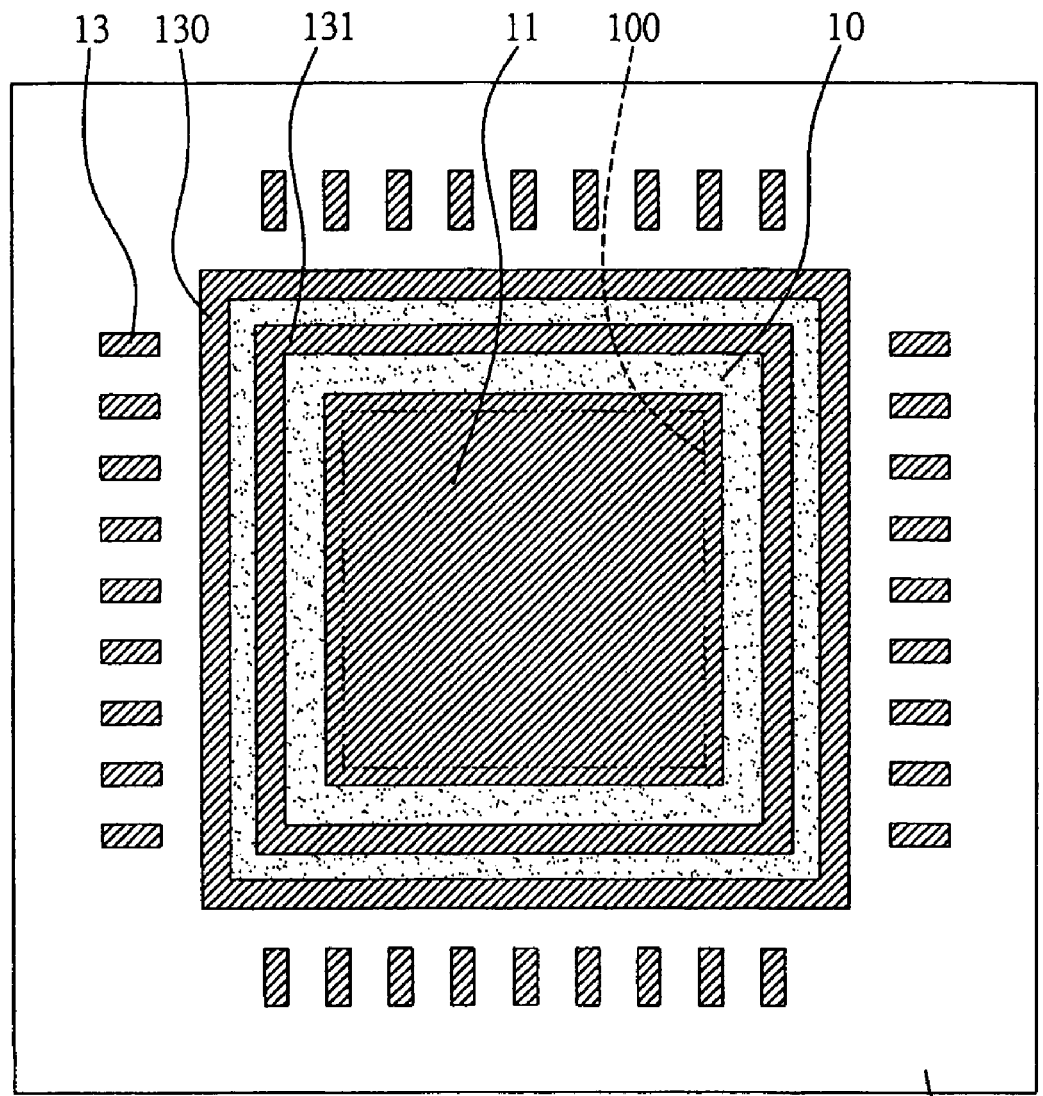
Figure 3F:
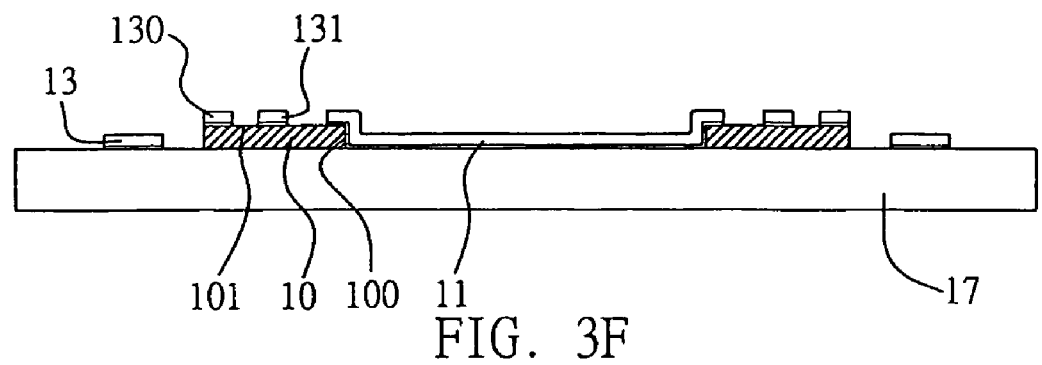

Referring to FIG. 3B, secondly, a thin metal layer 170 such as a copper layer is formed on the carrier 17 by electroless plating, sputtering, vapor deposition or any other suitable conventional techniques, wherein the thickness of the thin metal layer 170 is about 0.05 μm to 0.2 μm. The thin metal layer 170 covers the insulating structure 10. Then, as shown in FIG. 3C, a plating mask 171 such as a dry film is applied on the thin metal layer 170 by a suitable conventional technique, and is formed with openings predetermined for plating a plurality of electrical contacts (such as signal pads, a ground ring, a power ring, etc.) and a die pad. Subsequently, as shown in FIG. 3D, a metal layer is plated in each of the openings of the plating mask 171. After removing the plating mask 171 and etching off the thin metal layer 170 under the plating mask 171, the plating process for forming the plurality of electrical contacts 13, 130, 131 and the electroplated die pad 11 is completed, as shown in FIGS. 3E and 3F. The electrical contacts such as a ground ring 131 and a power ring 130 are provided on a top surface 101 of the insulating structure 10, and the electrical contacts such as signal pads 13 are provided around the insulating structure 10. The electroplated die pad 11 is formed in the opening 100 of the insulating structure 10 and covers a portion of the top surface 101 of the insulating structure 10 around the opening 100, that is, the size of the electroplated die pad 11 is larger than the cross-sectional area of the opening 100. The electrical contacts 13, 130, 131 can be thin pads each made of gold/palladium/nickel/palladium metal layers.

Figure 3G:
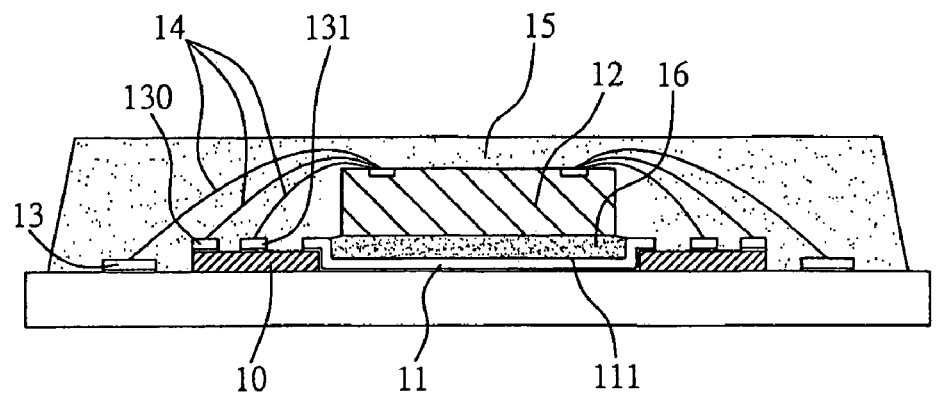

Next, as shown in FIG. 3G, a thermally conductive adhesive 16 such as silver paste is applied on a top surface 111 of the electroplated die pad 11, and a chip 12 is attached to the top surface 111 of the electroplated die pad 11 via the thermally conductive adhesive 16, wherein the size of the chip 12 is slightly smaller than the cross-sectional area of the opening 100 of the insulating structure 10, such that heat generated from the chip 12 can be transmitted to the electroplated die pad 11 through the thermally conductive adhesive 16 and then dissipated to an external environment through the electroplated die pad 11. Then, a wire-bonding process is performed to form a plurality of bonding wires such as gold wires 14 for electrically connecting the chip 12 to the electrical contacts 13, 130, 131. The wire-bonding process is well known in the art and is not to be further detailed herein. Subsequently, a molding process is performed to form an encapsulant 15 on the carrier 17 to encapsulate the chip 12, the electrical contacts 13, 130, 131, the gold wires 14, the insulating structure 10 and a portion of the electroplated die pad 11, wherein the encapsulant 15 is made of a conventional material such as epoxy resin. The molding process is also well known in the art and is not to be further detailed herein.

Figure 3H:
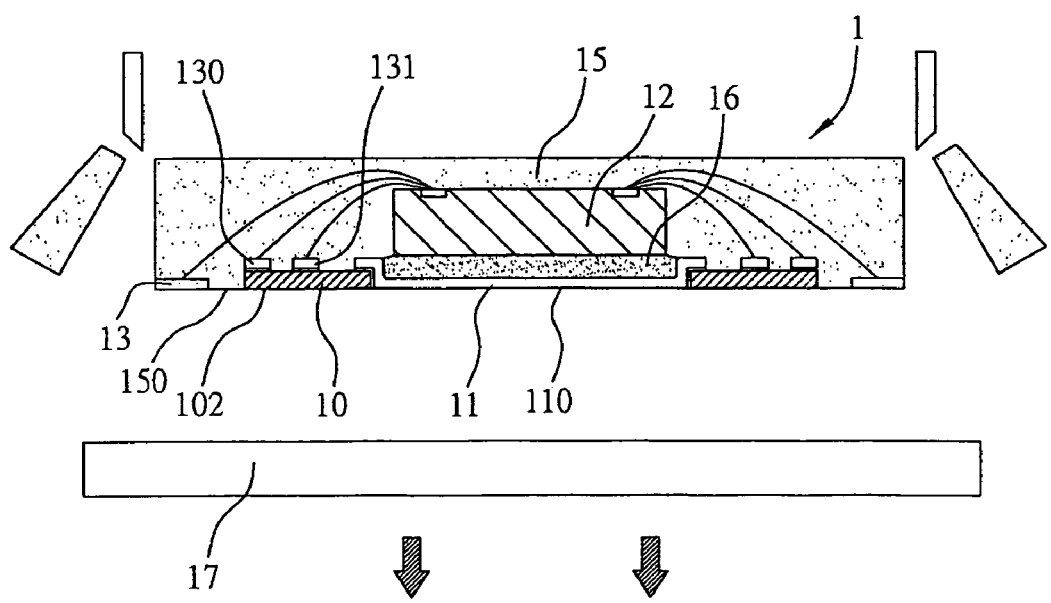
Figure 4:
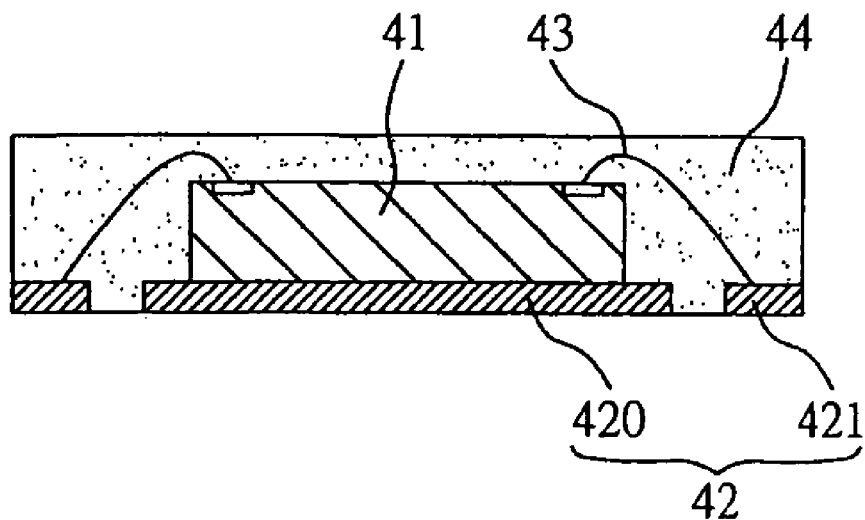
FIGS. 4 to 8 (PRIOR ART) are schematic cross-sectional views of five conventional semiconductor packages respectively.
Figure 5:
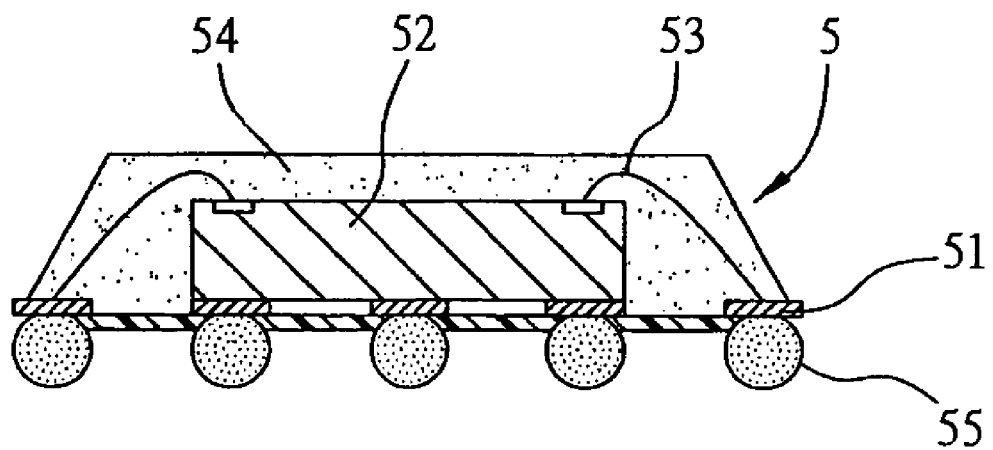
Figure 6:
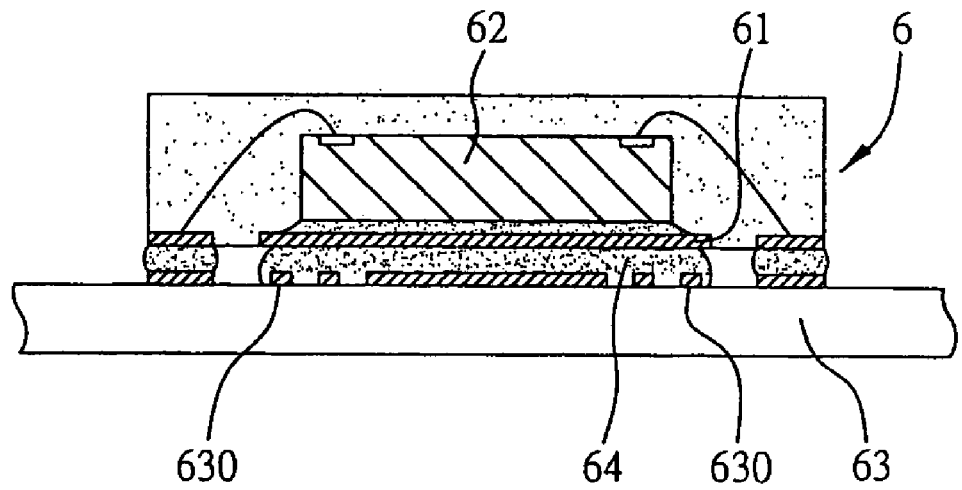
Figure 7:
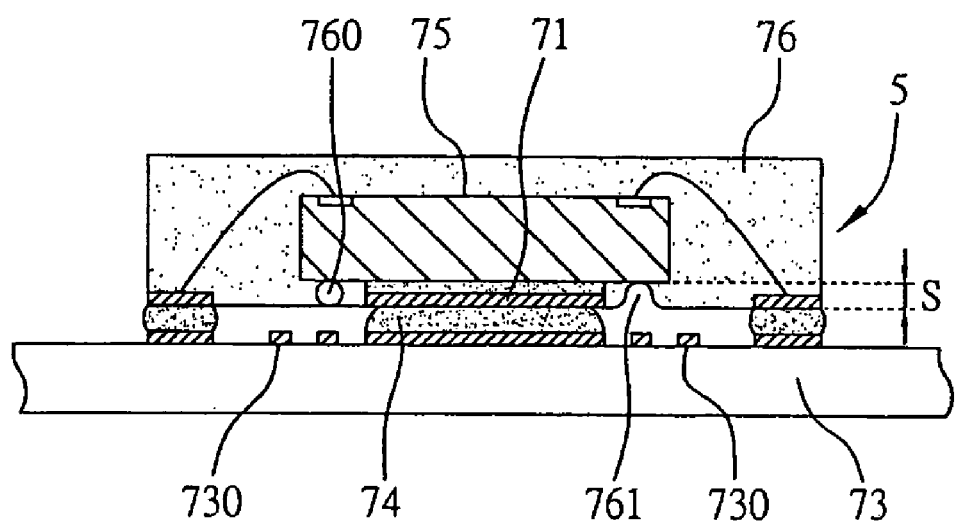
Figure 8:
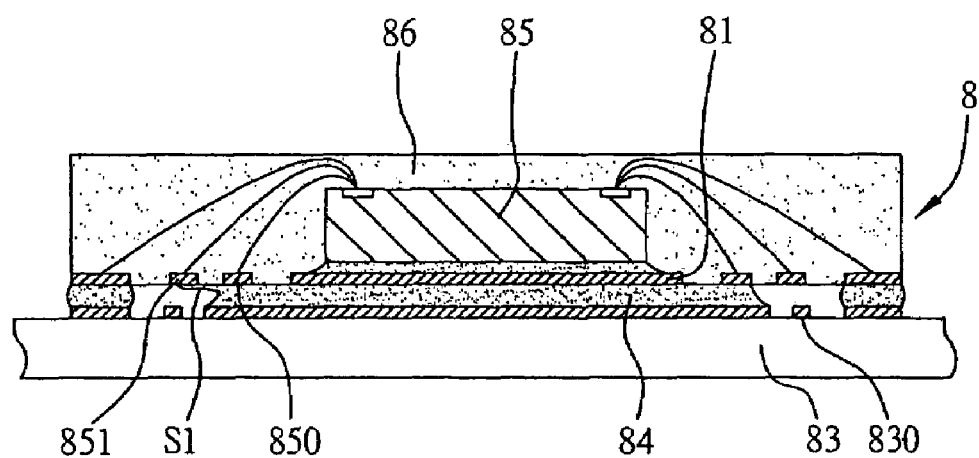

Finally, as shown in FIG. 3H, after the encapsulant 15 is formed, the carrier 17 is removed from the encapsulant 15 by a chemical etching process, and subsequently, a singulation process is performed to form a singulated semiconductor package 1 without a chip carrier. As shown in FIG. 3H, a bottom surface 102 of the insulating structure 10, a bottom surface 110 of the electroplated die pad 11 and bottom surfaces of the electrical contacts 13 are exposed from the encapsulant 15 and are flush with a bottom surface 150 of the encapsulant 15, such that the semiconductor package 1 can be electrically connected to an external device such as a circuit board by solder paste (not shown), and the electrical contacts 130, 131 are electrically isolated from the external device by the insulating structure 10. It should be noted that the sequence of removing the carrier 17 and performing the singulation process can be altered or reversed.

In addition, compared with the semiconductor package 1, the semiconductor packages 1a to 1f of the second to seventh embodiments of the present invention structurally differ primarily in the size of the opening of the insulating structure or the number of the electrical contacts, such that the above fabrication steps shown in FIGS. 3A to 3H are also applicable for forming the semiconductor packages 1a to 1f with the changes of the opening size or the number of the electrical contacts being taken into account, which are modifications understandable for a person skilled in the art, such that details for fabricating the semiconductor packages 1a to 1f are not further described herein.

The present invention has been described using exemplary preferred embodiments above, however, it is to be understood that the scope of the present invention is not limited to the disclosed embodiments. On the contrary, it is intended to cover various modifications and similar changes. The scope of the claims, therefore, should be accorded the broadest interpretation so as to encompass all such modifications and similar arrangements.

What is claimed is:
1. A semiconductor package without a chip carrier, comprising:
   an insulating structure having an opening;
   an electroplated die pad provided in the opening of the insulating structure;
   a chip attached to the electroplated die pad by an adhesive;
   a plurality of electrical contacts formed around the electroplated die pad, wherein at least one of the electrical contacts is provided on a top surface of the insulating structure;
   a plurality of electrical connection members for electrically connecting the chip to the electrical contacts; and
   an encapsulant for encapsulating the chip, the insulating structure, the electrical connection members and the electrical contacts, wherein a bottom surface of the insulating structure, a bottom surface of the electroplated die pad and bottom surfaces of the electrical contacts, except the at least one electrical contact provided on the top surface of the insulating structure, are exposed from the encapsulant and are flush with a bottom surface of the encapsulant.

2. The semiconductor package of claim 1, wherein the insulating structure is made of thermoelastic resin.

3. The semiconductor package of claim 1, wherein a cross-sectional area of the opening of the insulating structure is smaller than a size of the electroplated die pad, such that a peripheral portion of the electroplated die pad covers a portion of the insulating structure.

4. The semiconductor package of claim 1, wherein a cross-sectional area of the opening of the insulating structure is equal to a size of the electroplated die pad, such that the electroplated die pad is coupled to the insulating structure and embedded in the opening.

5. The semiconductor package of claim 1, wherein a cross-sectional area of the opening of the insulating structure is larger than a size of the electroplated die pad.

6. The semiconductor package of claim 1, wherein the at least one electrical contact provided on the top surface of the insulating structure includes a ground ring.

7. The semiconductor package of claim 1, wherein the at least one electrical contact provided on the top surface of the insulating structure includes a ground ring and a power ring.

8. The semiconductor package of claim 1, wherein the electrical contacts with the bottom surfaces thereof being exposed from the encapsulant include a plurality of signal pads.

9. The semiconductor package of claim 1, wherein the electrical contacts with the bottom surfaces thereof being exposed from the encapsulant include a ground ring and a plurality of signal pads.

10. The semiconductor package of claim 1, wherein the adhesive is silver paste.

11. A fabrication method of a semiconductor package without a chip carrier, comprising the steps of:
forming an insulating structure on a carrier, the insulating structure having an opening;
forming a plurality of electrical contacts on the carrier and an electroplated die pad in the opening by an electroplating process, wherein at least one of the electrical contacts is provided on a top surface of the insulating structure;
attaching a chip to the electroplated die pad by an adhesive;
electrically connecting the chip to the electrical contacts by a plurality of electrical connection members;
forming an encapsulant for encapsulating the chip, the insulating structure, the electrical contacts and the electrical connection members, wherein a bottom surface of the insulating structure, a bottom surface of the electroplated die pad and bottom surfaces of the electrical contacts, except the at least one electrical contact provided on the top surface of the insulating structure, are exposed from the encapsulant and are flush with a bottom surface of the encapsulant; and
removing the carrier by an etching process.

12. The fabrication method of claim 11, further comprising a singulation process to form a singulated semiconductor package after removing the carrier.

13. The fabrication method of claim 11, further comprising a singulation process to form a singulated semiconductor package before removing the carrier.

14. The fabrication method of claim 11, wherein the insulating structure is formed by preforming the insulating structure and attaching the preformed insulating structure to the carrier.

15. The fabrication method of claim 11, wherein a cross-sectional area of the opening of the insulating structure is smaller than a size of the electroplated die pad, such that a peripheral portion of the electroplated die pad covers a portion of the insulating structure.

16. The fabrication method of claim 11, wherein a cross-sectional area of the opening of the insulating structure is equal to a size of the electroplated die pad, such that the electroplated die pad is coupled to the insulating structure and embedded in the opening.

17. The fabrication method of claim 11, wherein a cross-sectional area of the opening of the insulating structure is larger than a size of the electroplated die pad.

18. The fabrication method of claim 11, wherein the at least one electrical contact provided on the top surface of the insulating structure includes a ground ring.

19. The fabrication method of claim 11, wherein the at least one electrical contact provided on the top surface of the insulating structure includes a ground ring and a power ring.

20. The fabrication method of claim 11, wherein the electrical contacts with the bottom surfaces thereof being exposed from the encapsulant include a plurality of signal pads.

21. The fabrication method of claim 11, wherein the electrical contacts with the bottom surfaces thereof being exposed from the encapsulant include a ground ring and a plurality of signal pads.

22. The fabrication method of claim 11, wherein the insulating structure is made of thermoelastic resin.

23. The fabrication method of claim 11, wherein the adhesive is silver paste.

24. The fabrication method of claim 11, wherein the carrier is made of a metallic material.

25. A semiconductor package without a chip carrier, comprising:
an insulating structure having an opening;
an electroplated die pad provided in the opening and having a peripheral portion thereof covering a portion of the insulating structure;
a chip attached to the electroplated die pad by a thermally conductive adhesive;
a plurality of signal pads formed around the insulating structure;
a plurality of electrical connection members for electrically connecting the chip to the signal pads; and
an encapsulant for encapsulating the chip, the insulating structure, the electrical connection members and the signal pads, wherein bottom surfaces of all the insulating structure, the electroplated die pad and the signal pads are exposed from the encapsulant and are flush with a bottom surface of the encapsulant.

26. A fabrication method of a semiconductor package without a chip carrier, comprising the steps of:
forming an insulating structure on a carrier, the insulating structure having an opening;
providing a plurality of signal pads on the carrier and an electroplated die pad in the opening by an electroplating process, wherein a peripheral portion of the electroplated die pad covers a portion of the insulating structure;
attaching a chip to the electroplated die pad by a thermally conductive adhesive, so as to allow heat generated from the chip to be transmitted to the electroplated die pad through the thermally conductive adhesive;
electrically connecting the chip to the signal pads by a plurality of electrical connection members;
forming an encapsulant for encapsulating the chip, the insulating structure, the signal pads and the electrical connection members, wherein bottom surfaces of all the insulating structure, the electroplated die pad and the signal pads are exposed from the encapsulant and are flush with a bottom surface of the encapsulant; and
removing the carrier by an etching process.

27. A semiconductor package without a chip carrier, comprising:
an insulating structure having an opening;
an electroplated die pad provided in the opening of the insulating structure;
a chip attached to the insulating structure and the electroplated die pad by a thermally conductive adhesive;
a plurality of electrical contacts formed around the electroplated die pad, wherein at least one of the electrical contacts is provided on a top surface of the insulating structure;
a plurality of electrical connection members for electrically connecting the chip to the electrical contacts; and
an encapsulant for encapsulating the chip, the insulating structure, the electrical connection members and the electrical contacts, wherein a bottom surface of the insulating structure, a bottom surface of the electroplated die pad, and bottom surfaces of the electrical contacts, except the at least one electrical contact provided on the top surface of the insulating structure, are exposed from the encapsulant and are flush with a bottom surface of the encapsulant.

* * * * *